United States Patent [19]

Vora

[11] Patent Number: 4,721,831

[45] Date of Patent: Jan. 26, 1988

[54] MODULE FOR PACKAGING AND ELECTRICALLY INTERCONNECTING INTEGRATED CIRCUIT CHIPS ON A POROUS SUBSTRATE, AND METHOD OF FABRICATING SAME

[75] Inventor: Harshadrai Vora, Eden Prairie, Minn.

[73] Assignee: Unisys Corporation, Detroit, Mich.

[21] Appl. No.: 7,766

[22] Filed: Jan. 28, 1987

[51] Int. Cl.⁴ .............................................. H05K 1/00
[52] U.S. Cl. ..................................... 174/68.5; 29/829; 29/830; 174/137 A; 427/289; 428/161
[58] Field of Search ................... 174/68.5, 137 A, 209; 29/829, 830, 846; 361/414; 428/161, 474.4, 698, 702; 427/289, 290, 292; 51/317, 323, 328

[56] References Cited

U.S. PATENT DOCUMENTS

| 1,128,747 | 2/1915 | Boehm | 174/209 |
| 1,995,150 | 3/1935 | Kaplan | 174/209 |
| 3,683,105 | 8/1972 | Shamash et al. | 29/830 X |
| 3,909,680 | 5/1974 | Tsunashima | 174/68.5 X |
| 3,918,220 | 11/1975 | Jury et al. | 51/328 |
| 3,996,702 | 12/1976 | Leahy | 51/328 |
| 4,055,451 | 10/1977 | Cockbain et al. | 428/698 X |
| 4,277,522 | 7/1981 | Dorfeld | 427/292 |
| 4,322,778 | 3/1982 | Barbour et al. | 174/68.5 X |
| 4,410,927 | 10/1983 | Butt | 361/414 X |
| 4,490,457 | 12/1984 | Kardashian et al. | 174/68.5 X |
| 4,498,122 | 2/1985 | Rainal | 361/414 |
| 4,620,264 | 10/1986 | Ushifusa et al. | 174/68.5 X |

FOREIGN PATENT DOCUMENTS 228789 6/1960 Australia ........................ 174/137 A Primary Examiner—Morris H. Nimmo
Attorney, Agent, or Firm—Charles J. Fassbender; L. Joseph Marhoefer

[57] ABSTRACT

A module for packaging and electrically interconnecting integrated circuit chips comprises: a porous ceramic substrate which has a major surface that is pitted by a portion of the pores. Voltage planes and ground planes lie internal to the substrate, and metal filled via holes feed through the substrate. A second material fills the pores in the major surface to form a pit free surface. This second material is of a type which resists abrasion substantially less than the ceramic substrate. And metal lines are disposed over the pit free surface for interconnecting the metal filled via holes to the integrated circuits.

12 Claims, 10 Drawing Figures

MODULE FOR PACKAGING AND ELECTRICALLY INTERCONNECTING INTEGRATED CIRCUIT CHIPS ON A POROUS SUBSTRATE, AND METHOD OF FABRICATING SAME

BACKGROUND OF THE INVENTION

This invention relates to integrated circuits; and more particularly, it relates to modules for packaging and electrically interconnecting multiple integrated circuit chips.

Conventionally, integrated circuit chips are separately encapsulated in ceramic or plastic packages from which input/output pins extend. These packages are then electrically interconnected to form larger modules by mounting them on a printed circuit board. There, electrical conductors that are etched from copper foil selectively interconnect the input/output pins.

However, a problem with packaging and electrically interconnecting chips in the above fashion is that too much space is occupied. This is because the input/output pins to each chip plus the encapsulant around each chip plus the conductors on the printed circuit between the chips take up as much or more space than the chips themselves.

To avoid this problem, multiple integrated circuit chips have been mounted on a semiconductor wafer (substrate) that is patterned with thin film conductors to interconnect the chips. Bump leads, which carry signals to and from the chips, are provided on the chips; and they attach to bonding pads on the wafer.

However, by packaging chips on a semiconductor wafer in the above fashion, several new problems occur. Firstly, a semiconductor wafer is very brittle, and thus it can easily crack. Also, metal filled via holes cannot be formed through the wafer; so signal leads from the wafer must be routed off the side of the wafer rather than through the bottom of the wafer where they would take less space. Further, no voltage planes or ground plane can be provided inside of the wafer.

These problems, it has been observed by the present inventor, could be overcome if it were possible to use co-fired alumina ceramic, rather than a semiconductor wafer, as the substrate for holding the integrated circuit chips. And, a conceptual drawing of such an integrated circuit package has been published by the present inventor in the *IEEE Transactions on Components, Hybrids, and Manufacturing Technology*, December, 1984. However, it has since been discovered by the present inventor that the published conceptual integrated circuit package has some serious operational problems. In particular, co-fired ceramic is a porous material; and the pores are too large to enable thin film conductors to be patterned on the ceramic surface without causing numerous shorts and open circuits to occur in them. These shorts and open circuits are described herein in greater detail in conjunction with FIGS. 4A, 4B, 5, and 6.

Accordingly, a primary object of the invention is to provide a module for electrically interconnecting multiple integrated circuit chips in which all of the above problems are overcome.

BRIEF SUMMARY OF THE INVENTION

This object, and others, is achieved in accordance with the invention by a module for electrically interconnecting integrated circuits which comprises a porous ceramic substrate which has a major surface. Co-fired ground and voltage planes lie in the substrate parallel to the major surface, and metal filled via holes carry signals from the major surface through the substrate. Since the ceramic substrate is porous, the major surface is pitted by a portion of the pores. However, a second material fills the pores in the pitted surface to form a pit free surface. In order to fabricate such a pit free surface, this second material must be of a type which resists abrasion substantially less than the ceramic substrate. Thin film metal lines are then disposed over the pit free surface for interconnecting the integrated circuit chips to the metal filed via holes.

BRIEF DESCRIPTION OF THE DRAWINGS

Various features and advantages of the invention are described herein in conjunction with the accompanying drawings wherein:

FIG. 5 is a microphotograph of a pit in the surface of a ceramic substrate before it is filled with the process of FIGS. 3A-3D; and FIG. 6 is a microphotograph of a pit in the surface of a ceramic substrate after it is filled with the process of FIGS. 3A-3D.

DETAILED DESCRIPTION OF THE INVENTION

Figure 1:
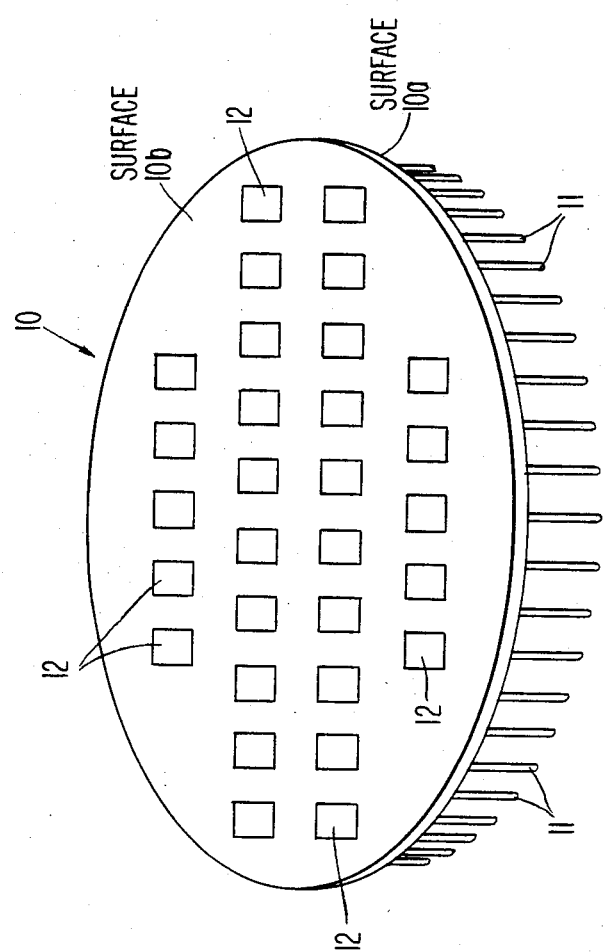
FIG. 1 is a pictorial view of one embodiment of the invention.
Figure 2:
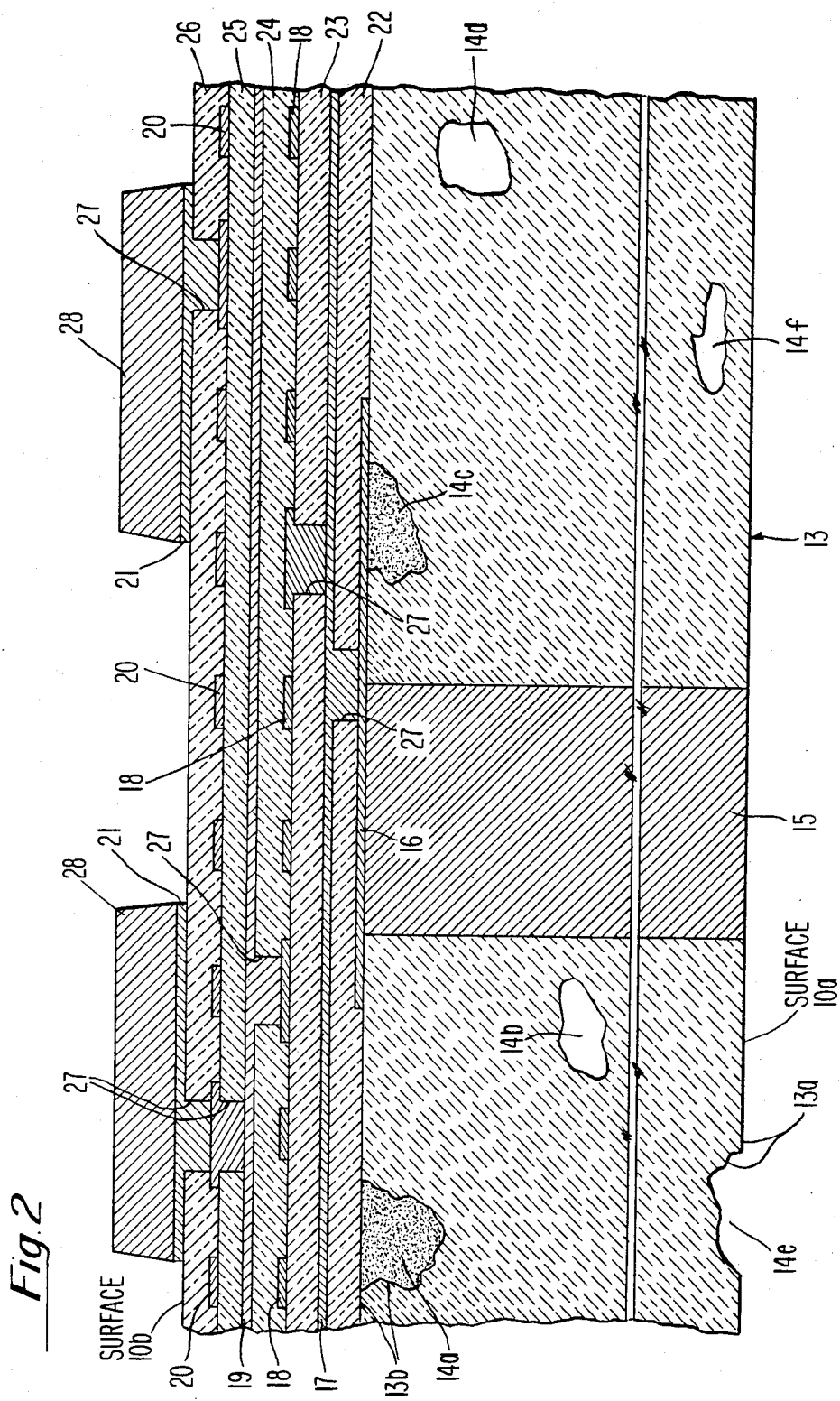
FIG. 2 is a greatly enlarged cross-sectional view of the FIG. 1 embodiment.

Referring now to FIGS. 1 and 2, a preferred embodiment of a module 10 for electrically interconnecting integrated circuit chips in accordance with the invention will be described in detail. A pictorial view of module 10 is shown in FIG. 1; and a greatly enlarged cross section of module 10 shows the module's internal details in FIG. 2.

Module 10 has two major surfaces 10a and 10b. Attached to surface 10a are a plurality of input/output pins (I/O pins) 11, and attached to surface 10b are a plurality of integrated circuit chips 12. These chips 12 and I/O pins 11 are interconnected in a predetermined fashion by thousands of minute conductors which lie within the module.

In operation, input signals are applied to some of the I/O pins 11. From there, the input signals are carried by the conductors within module 10 to the integrated circuit chips 12. In response, the chips 12 interact via the conductors and thereby generate output signals. These output signals are then routed on the conductors to some of the I/O pins 11.

Turning now to FIG. 2, the details of the internal structure of module 10 will be described. It includes a substrate 13 of a porous material such as co-fired alumina ceramic. Some of the pores are indicated by reference numerals 14a, 14b, 14c, 14d, 14e and 14f. These pores have numerous causes, including "gassing out" of certain binders withing the green ceramic when it is "fired".

That is, green ceramic is conventionally cured by heating it to a high temperature such as 1600° C.; and during this heating step, certain binders within the ceramic vaporize and escape which leaves the pores behind. These pores are irregular in shape and typically are up to one mil (25 micrometers) in diameter. Also, these pores occur with a density of at least one pore per 0.001 cubic inch.

Preferably, the ceramic substrate 13 is fifty to ninety mils thick. This enables the substrate 13 to support the conductors which overlie the substrate with a much higher degree of strength than if those conductors were fabricated above a semiconductor substrate.

Also preferably, the substrate 13 is about the same diameter as a semiconductor wafer (i.e., three inches to six inches in diameter). This enables the conductors which overlie the substrate to be patterned with the same photolighographic processes and same small dimensions as thin film conductors in an integrated circuit chip.

A plurality of metal filled via holes 15 run from one surface 13a of substrate 13 to an opposite surface 13b. They form feedthrough conductors, and one such conductor 15 exists for each I/O pin 12. Suitably, these conductors 15 are three to eight mils in diameter. Also, power planes and ground planes (not shown) are included in the substrate, and they run parallel to the surfaces 13a and 13b.

Both the power and ground planes, and feedthrough conductors 15 are made of tungsten, or an alloy of tungsten and molybdenum, which is co-fired with the alumina ceramic. Note that in a semiconductor wafer, no such feedthrough conductors and no such power and ground planes exist.

Surface 13a of substrate 13 forms the previously described surface 10a to which the I/O pins 11 attach, and that surface can have unfilled pores such as 14e. This is because the I/O pins 11 have wide heads which are attached to the feedthrough conductors 15 by brazing or soldering, and the strength of such a joint is not affected by the presence of the pores.

Figure 4A:
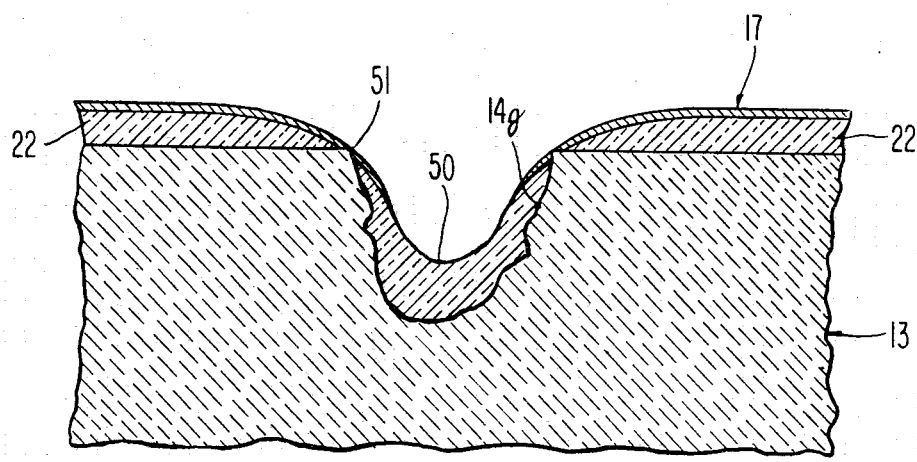
FIGS. 4A and 4B illustrate various shorts and open circuits which are avoided by the process of FIGS. 3A-3D.
Figure 4B:
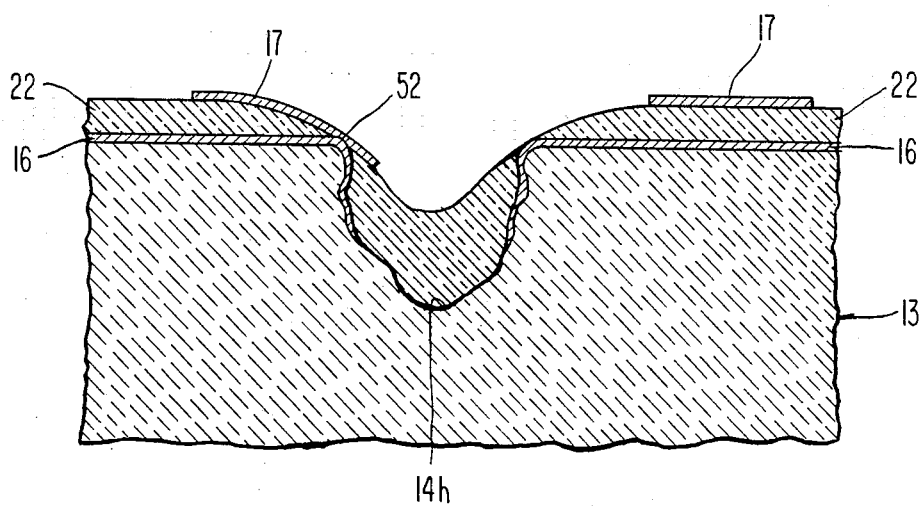

By comparison, all of the pores in surface 13b must be filled. This is because the overlying conductors and insulating layers are very thin and delicate. If the pores in surface 13b are unfilled, various shorts and open circuits will occur in the overlying conductors. These are shown in FIGS. 4A and 4B.

To overcome this shorting and open circuit problem, all of the pores in surface 13b are filled with a material which resists abrasion substantially less than the ceramic substrate. This is indicated in FIG. 2 by the dots within the pores 14a and 14c. How these pores in surface 13b are filled will be described shortly in detail in conjunction with FIGS. 3A thru 3D.

First, however, consider the remaining structure of the FIG. 2 interconnect module. It includes six layers of patterned conductors 16 thru 21, and five dielectric layers 22 thru 26. These dielectric layers are interleaved with the conductor layers 16 thru 21 as FIG. 2 illustrates.

Preferably, each of the conductor layers 16 thru 21 is between one and five micrometers thick; and each of the dielectric layers 22 thru 26 is between two and sixteen micrometers thick. Suitable materials for the conductor layers and the dielectric layers respectively are chromium-copper-chromium and polymide. These thicknesses and materials enable the various conductor layers to be substantially planar, and thus allow the conductors to be patterned in very narrow widths by photolithographic processes used in making semiconductors.

Layer 16 is patterned to form capture pads which are circular in shape and contact a respective feedthrough conductor 15. Each capture pad is substantially wider than its corresponding feedthrough conductor (such as five times wider) to insure that contact will occur even though the exact position of the feedthrough conductor varies due to the ceramic substrate 13 shrinking when it is fired.

Conductors in the overlying layers 17 thru 20 are patterned to any desired width and spacing, such as ten and twenty micrometers respectively. Signals are transferred between the conductors of different layers through metal filled via holes as indicated by reference numeral 27. On the topmost layer, the conductors 21 are patterned to form pads, on which solder bumps 28 are disposed to contact and hold terminals on the integrated circuit chips. Suitably, the pads 21 are five mils wide and five mils apart; and the solder bumps are one mil high.

Figure 3A:
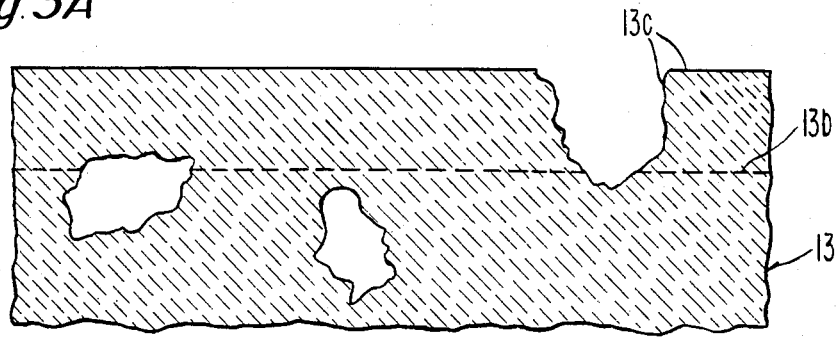
FIGS. 3A-3D illustrate a process for fabricating the embodiments of FIGS. 1 and 2.

Next, reference should be made to FIGS. 3A-3D wherein the steps of a process for fabricating the FIG. 2 structure are illustrated. This process begins with the substrate 13 after it has been fired. Initially, as shown in FIG. 3A, one surface 13c of that substrate 13 is lapped and polished to thereby obtain the previously described surface 13b.

This lapping and polishing step removes about two to six mils of material from substrate 13; and the new surface 13b which is thereby obtained is substantially flatter than the original surface 13c. That original surface 13c may, for example, have some warpage or camber which occurs when the ceramic is fired.

Suitably, the lapping step is performed with an iron wheel which is embedded with diamond particles of about three micrometers diameter; and the polishing step is performed with a copper wheel which also is embedded with diamond particles of about the same diameter. Note, however, that substrate 13 is porous throughout its interior, and thus the new surface 13b will still be pitted. This is because new pores are continually being exposed as the lapping and polishing step occurs.

Figure 3B:
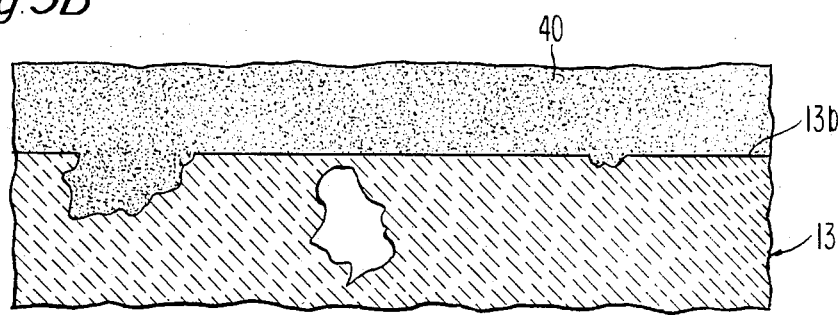

Subsequently, as indicated in FIG. 3B, a coat of liquid polyimide 40 of about five to fifteen micrometers thickness is spun on surface 13b. This fills all of the pits which the pores cause in surface 13b. Thereafter, the liquid polyimide is cured by baking it at about 400° C.; and an important property of this cured polyimide is that it resists abrasion substantially less than the ceramic substrate.

Figure 3C:
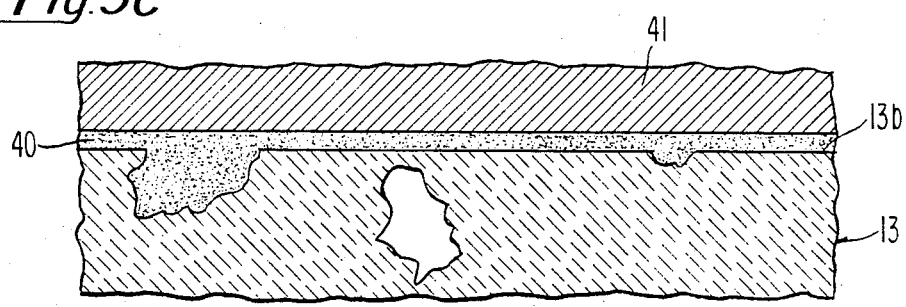

Later, as indicated in FIG. 3C, the cured polyimide layer 40 is worn down with an abrasive. This abrasive is selected such that it is soft enough to contact surface 13b of the ceramic substrate 13 without wearing that surface down.

Preferably, this step is performed by polishing the polyimide with a compliant pad 41 which is wetted with a slurry of water and abrasive particles. Some examples of suitable abrasives for the slurry are cerium oxide, zirconium oxide, and silica, with particle sizes in the range of one to four micrometers.

Alternatively, the polyimide film can be worn down by polishing it with the compliant pad 41 which is impregnated with abrasive particles such as those given above. In either case, suitable materials for the compliant pad 41 include cloths made primarily of polyurethane, polyester, wool, and cotton.

Figure 3D:
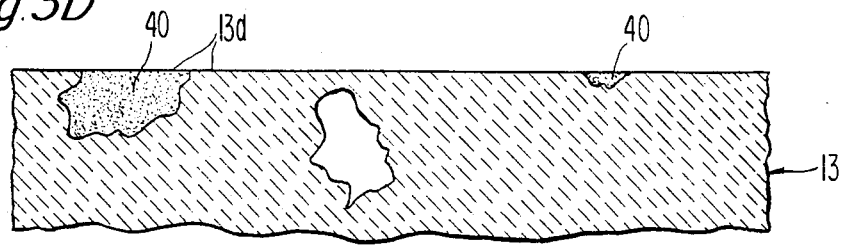

This removal step is continued until the polyimde film remains only in the pores of surface 13b but not on the flat portion of that surface. This is illustrated in FIG. 3D. As a result, a very smooth pit free surface 13d is obtained.

In obtaining this pit free surface 13d, note that the removal of the polyimide is a self-stopping process since the abrasive is selected to not be hard enough to remove any ceramic from substrate 13. If that were not the case, new pores within substrate 13 would be exposed and thereby make the resulting surface unsmooth.

To further appreciate the importance of having all of the pores in surface 13b filled, reference should now be made to FIGS. 4A and 4B. These figures show how various shorts and open circuits occur in the conductors 15 which overlie surface 13a if the pores are not filled.

Consider first FIG. 4A. It shows the ceramic substrate and a pore 14g at its surface. Lying on the surface of substrate 13 is the dielectric layer 22, and lying on layer 22 is the patterned conductor 17.

In FIG. 4A, the components 14g, 22, and 17 are all drawn to scale. Pore 14g is about eighteen micrometers deep; dielectric layer 22 is about three micrometers thick; and conductor 17 is about one micrometer thick. Also as FIG. 4A shows, dielectric layer 22 only partially fills pore 14g. As a result, conductor 17 is not planar but dips into the partially filled pore. As it dips, conductor 17 gets thinner and thinner until it becomes an open circuit as illustrated by reference numeral 50. Open circuits can also occur at the point where conductor 17 starts to enter pore 14g as indicated by reference numeral 51.

A similarly scaled drawing is shown in FIG. 4B. There, however, conductor layers 16 and 17 both dip into the same pore 14h. That pore is only partially filled by dielectric layer 22; and the dielectric layer becomes very thin or nonexistent at the perimeter of the pore. Consequently, a short occurs between conductors 16 and 17 at the perimeter of the pore as indicated by reference numeral 52.

Actual microphotographs of the pores which occur at the surface of substrate 13 are shown in FIGS. 5 and 6. FIG. 5 shows a pore which is about twenty micrometers long and which is unfilled. By comparison, FIG. 6 shows a pore after is has been filled with polyimide by the previously described process of FIGS. 3A–3D. When the disclosed interconnect structure is built on top of the FIG. 5 surface, the above-described shorting and open circuit problems occur; but no such problems occur with the FIG. 6 surface.

A preferred embodiment of a module for electrically interconnecting integrated circuit chips, as well as a preferred process for fabricating that module, have now been described in detail. In addition, however, many changes and modifications can be made to these details without departing from the nature and spirit of the invention.

For example, the substrate 13 can be constructed of various porous materials other than alumina ceramic. Some suitable substitutes include aluminum nitride, and beryllium oxide ceramics.

As another modification, the pores in surface 13b can be filled with a material other than polyimide. Such substituted materials need only have a liquid state in which it will fill pores in on surface 13b as described in conjunction with FIG. 3B; and have a solid state which resists abrasion substantially less than the porous substrate 13. For example, one such material is glass.

As still another modification, the wearing down step of FIG. 3C can be continued to the point where all of the pore-filling material is removed from the flat portion of surface 13b, and in addition, a small amount of that material is also removed from the surface pores. This in fact is advantageous in the case where the I/O feedthrough conductors 15 are less hard than substrate 13.

In such a case, the lapping and polishing step of FIG. 3A may cause some of the I/O feedthrough conductors 15 to lie a fraction of a micrometer below the flat portion of surface 13b. Thus a small film of the pore-filling material will remain on top of those I/O feedthrough conductors 15 if the removal step of FIG. 3C stops exactly at the flat portion of surface 13b. Preferably, however, less than two micrometers of the pore-filling material is removed from the pores in surface 13b so that the shorting and open circuit problems of FIGS. 4A and 4B are still avoided.

As still another modification, the substrate 13 which has its surface pores filled by the process of FIGS. 3A thru 3D may be used in practically any application where a substrate having a high degree of flatness and smoothness is required. For example, the substrate 13 having its surface pores filled can be used as a base for a mirror for a light beam or laser beam. Such a mirror will have a significantly improved reflectivity due to the fact that its base has a very smooth pit free surface.

Accordingly, since many such modifications to the above-described details can be made, it is to be understood that the invention is not limited to those details but is defined by the appended claims.

What is claimed is:

1. A module for packaging and electrically interconnecting integrated circuit chips, comprising:
    a porous ceramic substrate which has a major surface that is pitted by a plurality of pores;
    metal filled via holes that feed through said substrate;
    a filler material filling said pores in said major surface of said ceramic substrate and yet exposing the remainder of said major surface to form a porous free surface which is part ceramic and part filler material;
    said filler material being of a type which resists abrasion substantially less than said ceramic substrate; and
    metal lines disposed over said porous free surface for interconnecting said metal filled via holes to integrated circuits.

2. A module according to claim 1 wherein said filler material is selected from the group of polyimide and glass.

3. A module according to claim 2 wherein said porous substrate has at least one pore per 0.001 cubic inch.

4. A module for packaging and electrically interconnecting integrated circuits, comprising:
    a substrate of a first material which has a major surface that is pitted by a plurality of pores;
    a second material filling the pores in said major surface and yet exposing the remainder of said major surface to form a porous free surface which is made partly of said first material and partly of said second material;
    said second material being of a type which resists abrasion substantially less than said first material; and
    metal lines disposed over said porous free surface for interconnecting integrated circuits.

5. A module according to claim 4 wherein said first material is selected from the group of alumina, aluminum nitride, and beryllium oxide ceramics.

6. A module according to claim 4 wherein said second material is selected from the group of polyimide and glass.

7. A module according to claim 4 wherein some of said pores are at least ½ mil across.

8. A module comprising: a ceramic substrate which has a surface that is pitted by a plurality of pores; a filler material filling the pores in said pitted surface and yet exposing the remainder of said pitted surface to form a pit free surface which is part ceramic and part filler material; and said filler material being of a type which resists abrasion substantially less than said ceramic substrate.

9. A method of fabricating a module, for packaging and electrically interconnecting integrated circuits; said method including the steps of:
   providing a substrate of a porous material which has a surface that is pitted by a plurality of pores;
   coating said pitted surface and filling said pores therein with a liquid film of a material which has a solid state that resists abrasion substantially less than said substrate;
   solidifying said film on said surface and in said filled pores;
   wearing down said solidified film with an abrasive member which is soft enough to contact said surface of said porous material without wearing said surface down;
   stopping said wearing down step after said film is removed entirely off of said pitted surface but not out of the pores themselves to thereby obtain a pit free surface; and
   disposing metal lines over said pit free surface for interconnecting circuits.

10. A method according to claim 9 wherein said wearing step is performed by polishing said film with a pad and a slurry which contains abrasive particles.

11. A method according to claim 10 wherein said pad is a cloth that is made primarily of polyurethane, polyester, cotton, and wool.

12. A method according to claim 9 wherein said wearing step is performed by polishing said film with a pad that is impregnated with abrasive particles.

* * * * *